United States Patent [19]

Pines

[11] Patent Number: 5,323,295
[45] Date of Patent: Jun. 21, 1994

[54] ASSEMBLY FOR INTEGRATING HEAT GENERATING ELECTRONIC DEVICE WITH NONHEAT GENERATING DEVICES

[75] Inventor: Andrew J. Pines, Carol Stream, Ill.

[73] Assignee: P & P Marketing, Inc., Chicago, Ill.

[21] Appl. No.: 102,336

[22] Filed: Aug. 5, 1993

Related U.S. Application Data

[63] Continuation of Ser. No. 917,751, Jul. 21, 1992, abandoned.

[51] Int. Cl.⁵ .............................................. H05K 7/20
[52] U.S. Cl. ................................. 361/709; 174/16.3; 257/722; 330/66; 361/720
[58] Field of Search ....................... 330/66, 68, 298; 257/706, 707, 712, 718, 719, 722; 165/80.3, 185; 174/16.3, 35 R; 363/141; 361/690, 704, 707, 709, 712, 720, 722, 752, 760, 784, 785, 816

[56] References Cited

U.S. PATENT DOCUMENTS

| | | | |
|---|---|---|---|
| 3,987,344 | 10/1976 | Amruoso, Sr. | 361/386 |
| 4,015,173 | 3/1977 | Nitsche | 361/388 |
| 4,342,002 | 7/1982 | Gabr | 330/65 |
| 4,707,726 | 11/1987 | Tinder | 257/717 |
| 4,710,852 | 12/1987 | Keen | 361/386 |
| 4,712,160 | 12/1987 | Sato | 361/388 |
| 4,905,123 | 2/1990 | Windle | 361/388 |
| 4,933,746 | 6/1990 | King | 357/81 |
| 5,087,888 | 2/1992 | Mountz | 330/65 |
| 5,089,935 | 2/1992 | Ito | 361/383 |
| 5,130,888 | 7/1992 | Moore | 361/386 |
| 5,134,545 | 7/1992 | Smith | 361/388 |
| 5,168,425 | 12/1992 | Radack, Jr. | 361/386 |

FOREIGN PATENT DOCUMENTS 2052164 1/1981 United Kingdom ................ 361/383

Primary Examiner—Gerald P. Tolin
Attorney, Agent, or Firm—Gerstman, Ellis & McMillin, Ltd.

[57] ABSTRACT

An electronic power device for a juke box or the like comprises a highly thermally conductive heat sink defining a first cavity on one side thereof and a second cavity on the other side thereof, with the first and second cavities having a common, thermally conductive wall. A printed circuit board carries substantially nonheat generating components thereon and is located within the first cavity. At least one heat generating electronic component is provided, located in the second cavity. The circuit board and the generating electronic component are in electrical connection through the common, thermally conductive wall.

12 Claims, 2 Drawing Sheets

Fig. 1
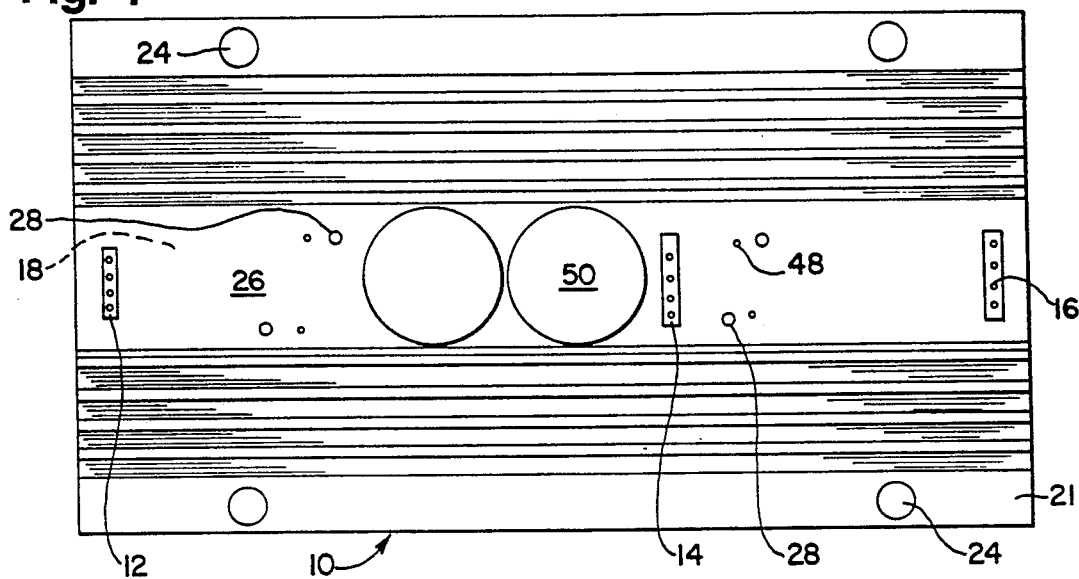
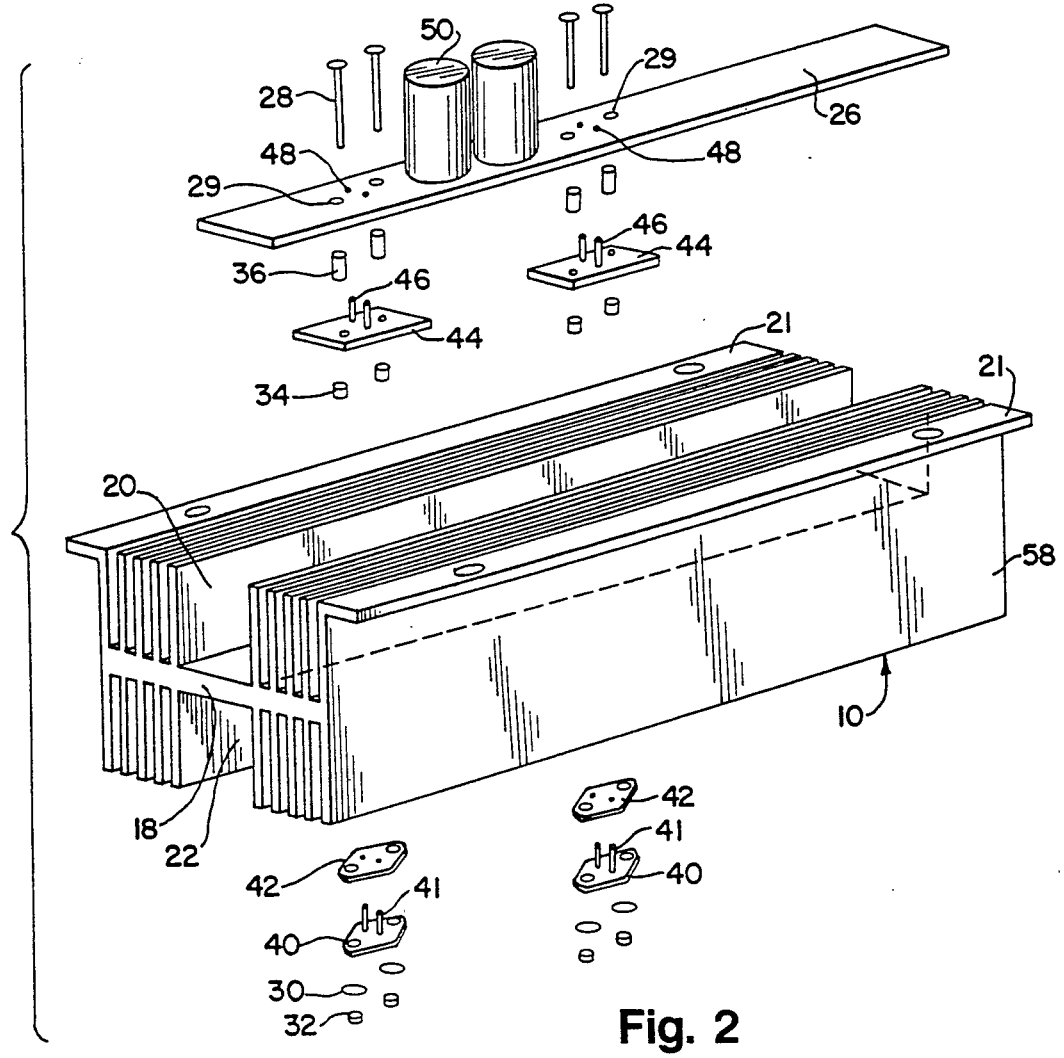
Fig. 2

ASSEMBLY FOR INTEGRATING HEAT GENERATING ELECTRONIC DEVICE WITH NONHEAT GENERATING DEVICES

This application is a continuation of U.S. application Ser. No. 917,751, filed Jul. 21, 1991 and now abandoned in the name of Andrew J. Pines, for "ELECTRONIC ASSEMBLY".

FIELD OF THE INVENTION

The present invention concerns a novel electronic power amplifier, which is simpler to manufacture and service and more mechanically reliable than those with traditional designs. Amplifiers are used in virtually all electronic applications, including, for example, audio, video, broadcast, data acquisition. Ever since the vacuum tube was invented, there has been a proliferation of amplifiers everywhere.

BACKGROUND OF THE INVENTION

Power amplifiers receive an input signal of low power and, using an electronic circuit, amplify the signal to higher power. This high power signal may then for example, be used to drive a transmitter or speaker.

Using present technology, a circuit which accomplishes this task includes components that generate substantial amounts of heat, and components that do not generate large amounts of heat.

The substantially heat producing components are placed in contact with a highly thermally conductive heat sink, which dissipates the excess thermal energy, thereby preventing the components from overheating.

A power amplifier, thus, must accomplish two goals: the circuit must be completed electrically and the heat generating components must be attached to a heat sink.

Amplifier designs of the prior art accomplish these goals in one of two ways: the first is typically used when the heat dissipation requirements are moderate. With this design, all components are inserted into a printed circuit board. Electrical connections are made by the traces of the printed circuit board. The heat sink is then mounted directly to the heat producing components. Heat dissipation is limited because the end product's chassis, which mechanically protects the circuit board, also encloses the heat sink. A window can be cut out from the chassis to expose the heat sink to the external environment, but the desired mechanical isolation of the printed circuit board is compromised.

The second prior art design mechanically separates the substantially heat producing devices from the remaining components. The heat producing components are mounted to the heat sink, which is typically mounted so that a significant amount of its surface area is external to the chassis compartment. The rest of the circuit is placed on printed circuit board. The electrical connections are completed by wires with connectors running between the printed circuit board and the heat producing devices. The principle disadvantages of this approach are the cost and complication added by the wiring and the physical separation of related components, which can induce noise, signal degradation, etc.

Desirable features of a power amplifier include: ease of production, large heat dissipation capacity, immunity to mechanical stress, minimized use of connectors and wiring, and ease of maintenance.

The invention finds advantage in its ability to satisfy the above stated design objectives, among others.

SUMMARY OF THE INVENTION

The invention is a power amplifier, which receives power and signals through connectors, and amplifies the signals to a high power signal. The amplified signals leave the amplifier through connectors.

By this invention, an electronic power device is provided which comprises: a highly thermally conductive heat sink defining a first cavity on side thereof and a second cavity on the other side thereof, with the first and second cavities having a common, thermally conductive wall. A printed circuit board carries substantially non-heat generating components thereon. At least one heat generating electronic component is present, with the printed circuit board being located within the first cavity and the heat generating electronic component being located within the second cavity. Means are provided for connecting the circuit board and the heat generating electronic component to the heat sink.

Preferably, the means connecting the circuit board and the heat generating electronic component comprises plug-in hardware. Also, the printed circuit board and the heat generating electronic component have leads and sockets which interconnect with each other in a complementary manner. Also, the common, thermally conductive wall defines a plurality of openings for receiving the leads to permit their extension through the wall.

The printed circuit board typically includes socket means while the heat generating electronic component includes lead means for extending into the socket means through the openings. Typically, the heat generating electronic component may comprise a power amplifier circuit, while the printed circuit board may include a permanent assembly of generally non-heat generating components and socket means, and/or leads, if desired. The heat generating component may comprise lead means for introduction into the socket means.

The invention's innovation is its mechanical assembly providing improved ease of production and maintenance, good immunity to mechanical stress, high heat dissipation capacity, minimized use of connectors and wiring, and good electrical connections.

The improvement is achieved by mounting the entire circuit board and amplifier circuit within cavities of a heat sink. When servicing is required, the entire amplifier or circuit board can easily be swapped, and the damaged unit repaired at a specialized location.

Heat dissipation capacity is high because much of the heat sink can be external to the chassis of the end product.

Electrical functionality also is improved because all components are in close proximity to each other.

A more detailed explanation of the invention, including specific mechanical assembly details, is provided in the following description and claims, and is illustrated in the accompanying drawings.

BRIEF DESCRIPTION OF THE DRAWINGS

FIG. 1 is a plan view of an amplifier assembly constructed in accordance with the principles of the present invention;

FIG. 2 is an exploded, perspective view of the amplifier assembly of FIG. 1, illustrating its assembly;

DESCRIPTION OF SPECIFIC EMBODIMENTS

Figure 3:
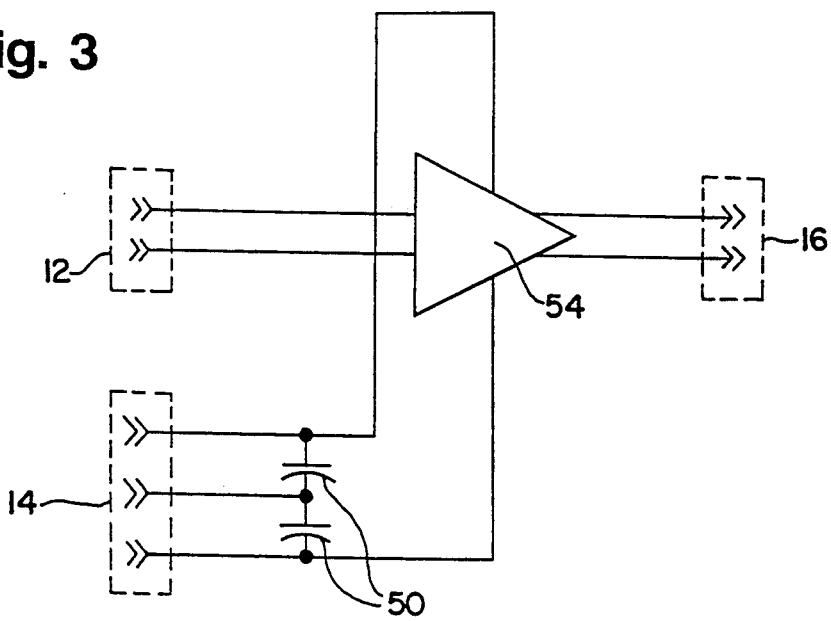
FIG. 3 is a schematic block diagram of the amplifier circuit.

Referring to the drawings, FIGS. 1 and 2 show the amplifier assembly having a heat sink body 10, which may be made of a single, complex, extruded piece of aluminum or the like having a retention flange 21 at one end thereof and open fins 58 at the other end. Heat sink body 10 carries a circuit board 26 which carries three electrical plug-in connectors 12, 14, 16, which communicate with circuit board 26. Connector 12 may communicate with wires to receive input signals. Connector 14 receives power. Connector 16 may be connected to drive outputs through the amplifier circuit.

Heat sink body 10 may have a plurality of holes 24 for mounting.

Circuit board 26, carrying generally conventional circuitry, may be mounted within first cavity 20 with bolts 28, which pass through apertures in central wall 18, washers 30, and nuts 32 for retention thereof. Additionally, spacers 34 and nylon sleeves 36 may be used to maintain the mechanical structure and spacing desired, with spacers and sleeves 34, 36 being made of an insulating material. Bolts 28 may also have the additional function of making electrical connection between the printed circuit board 26 in compartment 20 and heat producing amplifier circuit components 40, which are positioned in second compartment 22.

Amplifier circuit components 40, as shown in FIG. 2, may also be carried on bolts 28, being spaced from central wall 18 by insulator members 42.

Sockets 44 may be soldered on the bottom of printed circuit board 26, having prongs 46 that extend upwardly through apertures 48 of the printed circuit board.

Thus, the system may be easily assembled with plug-in hardware, where prongs 41 of amplifier circuit components 40 easily slide through holes in central wall 18 into contact with the prongs 46 of socket 44, and/or into contact with bolts 28, as desired to make electrical connection between the amplifier circuit components 40 and the printed circuit lines on circuit board 26. Capacitors 50 are also carried as desired on printed circuit board 26.

Prongs 46 of socket 44, in turn, pass through apertures 48 to engage into conductive relationship with the conductive leads of printed circuit board 26, with the specific design of prongs and sockets used for effecting this being conventional.

FIG. 3 shows a block diagram of a single amplifier circuit carried on chip 40 (FIG. 2), and communicating through conductive lines on printed circuit board 26 (FIG. 2) with the respective connectors 12, 14, 16. In the specific embodiment shown, two amplifier circuits 40 are carried by heat sink body 10 (FIG. 2).

Power is received through connectors 14, filtered with capacitors 50, and delivered to amplifier 54. The signal for processing is received through connectors 12, and output is sent through connectors 16 to a desired destination, typically in a juke box.

Figure 4:
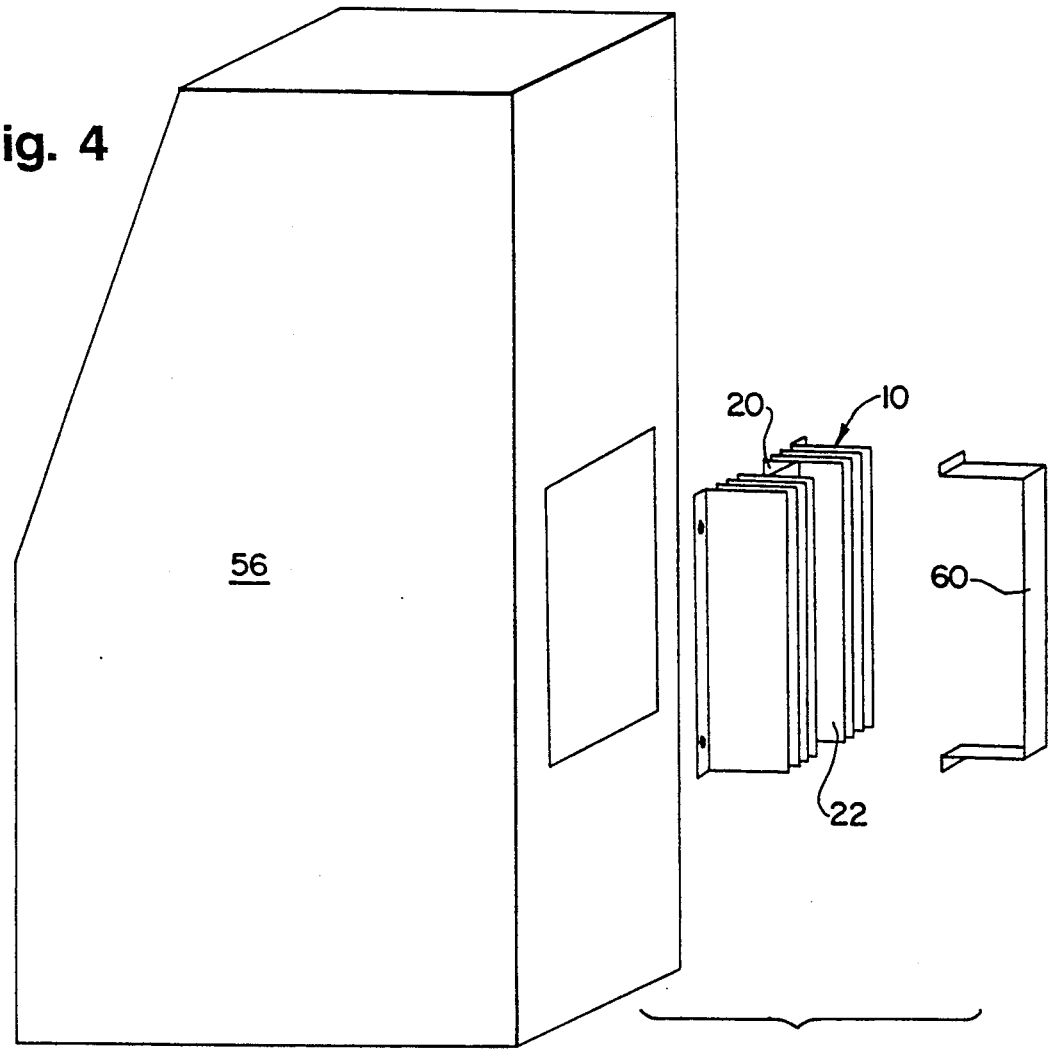
FIG. 4 is an exploded, perspective view of an end product, illustrating the amplifier's ease of service.

FIG. 4 shows the mounting of the heat sink body 10 and carried components of this invention to an end product such as a juke box 56 or otherwise a stereo, a radio transmitter, or the like. All of the fins 58 of heat sink body 10 are preferably mounted external to the wall of the housing of juke box or other unit 56, to facilitate removal of heat from the casing. Heat sink body 10 is mounted, preferably with first cavity 20 facing inwardly in order to provide maximum protection to circuit board 26 and the related components. At the same time, the heat producing amplifier components 40, and the fins, face outwardly. The electrical parts of both cavities are provided with additional protection by means of a U-shaped shield 60 which can snap into place to both protect electrical components and to help retain heat sink casing 10 in its desired position.

The above has been offered for illustrative purposes and is not intended to limit the scope of the invention of this application, which is as defined in the claims below.

That which is claimed is:

1. An electronic power device which comprises:
   a highly thermally conductive metal heat sink comprising a wall, a first plurality of fins extending from one side of said wall, a second plurality of fins extending from said one side of said wall and being spaced from said first plurality of fins to form a cavity on said one side of said wall;
   a printed circuit board carrying substantially non-heat generating components thereon;
   at least one heat generating electronic component;
   said at least one heat generating electronic component being mounted within said cavity in heat exchange relationship with said heat sink;
   said printed circuit board being mounted to the heat sink on the opposite side of said wall from said one side with said substantially non-heat generating components extending in a direction away from said wall on which said printed circuit board is mounted;
   said wall defining at least one opening;
   an electrical connector extending through said opening for electrically coupling said at least one heat generating electronic component on said one side of said wall to said printed circuit board on said opposite side of said wall.

2. An electronic power device as defined by claim 1, in which said printed circuit board has a perimeter which defines an area that is less than the area defined by the perimeter of said heat sink.

3. An electronic power device which comprises:
   a highly thermally conductive heat sink comprising a wall, a first plurality of fins extending from one side of said wall, a second plurality of fins extending from said one side of said wall and being spaced from said first plurality of fins to form a first cavity on one side of said wall;
   a third plurality of fins extending from the opposite side of said wall, a fourth plurality of fins extending from the opposite of said wall, said fourth plurality of fins being spaced from said third plurality of fins to form a second cavity on said opposite side of said wall;
   a printed circuit board carrying substantially non-heat generating components thereon;
   at least one heat generating electronic component;
   said at least one heat generating electronic component being located within said first cavity;
   said printed circuit board being located within said second cavity; and
   said circuit board and said at least one heat generating electronic component being connected to said heat sink.

4. An electronic power device as defined by claim 3, said wall defining at least one opening;
   an electrical connector extending through said opening for electrically coupling said at least one heat generating electronic component located within said first cavity to said printed circuit board located within said second cavity.

5. An electronic power device as defined by claim 3, mounted on a wall of a housing of an electronic device of which said electronic power device is a component, said first cavity having an opening on a first side of said heat sink, first flange means carried on said heat sink adjacent said first side, said first flange means serving to retain said heat sink adjacent the walls of said housing; said second cavity defining an opening at a second side of said heat sink.

6. An electronic power device as defined by claim 3, said printed circuit board and said at least one heat generating electronic component having leads and sockets which interconnect with each other in a complimentary manner.

7. An electronic power device as defined by claim 6, said wall defining a plurality of openings for receiving leads.

8. An electronic power device as defined by claim 7, said printed circuit board including socket means and said at least one heat generating electronic component including lead means for extending into said socket means through said openings.

9. An electronic power device as defined by claim 3, said at least one heat generating electronic component comprising a power amplifier circuit.

10. An electronic power device as defined by claim 3, said printed circuit board including a permanent assembly of generally non-heat generating components and socket means.

11. An electronic power device as defined by claim 10, said at least one heat generating component comprising lead means for introduction into said socket means.

12. An electronic power device as defined by claim 1, mounted on a wall of a housing of an electronic device of which said electronic power device is a component, said cavity having an opening on a first side of said heat sink, first flange means carried on said heat sink adjacent said first side, said first flange means serving to retain said heat sink adjacent the wall of said housing.

* * * * *